(12) United States Patent
Kim et al.

(10) Patent No.: US 6,395,652 B2
(45) Date of Patent: May 28, 2002

(54) METHOD OF MANUFACTURING THIN FILM TRANSISTOR

(75) Inventors: Cheol-Se Kim; Dong-Hee Kim, both of Taegu; Myeung-Kyu Lee, Kyoungsangbuk-do, all of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/736,308

(22) Filed: Dec. 15, 2000

(30) Foreign Application Priority Data

Dec. 31, 1999 (KR) ............................................. 99-67845

(51) Int. Cl.[7] ........................ H01L 21/31; H01L 21/469
(52) U.S. Cl. ........................ 438/792; 438/771; 438/776
(58) Field of Search ................................ 438/156, 149, 438/151, 771, 776, 792

(56) References Cited

U.S. PATENT DOCUMENTS

| | | | |
|---|---|---|---|
| 5,582,880 A | * | 12/1996 | Mochizuki et al. .......... 427/569 |
| 6,124,154 A | * | 9/2000 | Miyasaka et al. ........... 438/151 |
| 6,124,155 A | * | 9/2000 | Zhang et al. ............... 438/158 |
| 6,266,116 B1 | * | 7/2001 | Ohta et al. .................. 349/141 |

FOREIGN PATENT DOCUMENTS

| | | |
|---|---|---|
| JP | 56-135968 | 10/1981 |
| JP | 02027771 | 1/1990 |

* cited by examiner

Primary Examiner—Michael S. Lebentritt
Assistant Examiner—Bradley Smith
(74) Attorney, Agent, or Firm—Birch, Stewart, Kolasch & Birch, LLP

(57) ABSTRACT

A method of manufacturing a thin film transistor, includes preparing a process chamber having a stage, providing a substrate on the stage of the process chamber, injecting a first mixed gas of $NH_3$, $N_2$ and $SiH_4$ into the process chamber, forming a plasma in the process chamber and forming a silicon nitride film (SiNx) on the substrate, injecting a second mixed gas of $H_2$ and $SiH_4$ into the process chamber while removing the first mixed gas in the plasma state, forming a pure amorphous silicon film (a-Si:H) on the silicon nitride film using the second mixed gas, injecting a third mixed gas of $H_2$, $SiH_4$ and $PH_3$ into the process chamber while removing the second mixed gas in the plasma state, and forming a doped amorphous silicon film ($n^+$ a-Si:H) on the silicon nitride film using the second mixed gas.

22 Claims, 2 Drawing Sheets

METHOD OF MANUFACTURING THIN FILM TRANSISTOR

CROSS REFERENCE

This application claims the benefit of Korean Patent Application No. 1999-67845, filed on Dec. 31, 1999, under 35 U.S.C. § 119, the entirety of which is hereby incorporated by reference.

BACKGROUND OF THE INVENTION

1. Field of the Invention

The present invention relates to a method of manufacturing a thin film transistor, and more particularly, to a method of manufacturing a thin film transistor for use in a liquid crystal display (LCD) device.

2. Description of Related Art

Liquid crystal display (LCD) devices are in wide use as display devices capable of being reduced in weight, size and thickness. Of these, active matrix LCD devices, where thin film transistors (TFTs) and pixel electrodes are arranged in the form of a matrix, have been widely used due to a high resolution and an excellent performance of implementing moving images.

FIG. 1 is a cross-sectional view illustrating a liquid crystal panel of a typical active matrix LCD device. As shown in FIG. 1, the liquid crystal panel 20 includes lower and upper substrates 2 and 4 with a liquid crystal layer 10 interposed therebetween. The lower substrate 2, referred to as an array substrate, is divided into two regions: a region S; and a region P. TFTs are arranged on the region S as switching elements, and pixel electrodes 14 are arranged on the pixel region P. The upper substrate 4 includes a color filter 8 and a common electrode 12. Through the pixel electrode 14 and the common electrode 12, voltages are applied to the liquid crystal layer 10. In order to prevent a leakage of the liquid crystal, edge portions of the two substrate 2 and 4 are sealed by a sealant 6. The TFT receives signals from external drive integrated circuit (IC) to drive the pixel electrode 14.

An inverted staggered type TFT is used for a general LCD device because its simple structure and a high performance. The inverted staggered type TFT is divided into a back channel etch type and an etch stopper type. Hereinafter, the back channel etch type TFT is explained.

FIG. 2 is a cross-section view illustrating the typical back channel etch type TFT. As shown in FIG. 2, a gate electrode 30 is formed on a substrate 1. A gate insulating layer 32 is formed over the whole surface of the substrate 1 while covering the gate electrode 30. An active layer 34 and an ohmic contact layer 36 are sequentially formed on the gate insulating layer 32. Source and drain electrodes 38 and 40 overlap both end portions of the ohmic contact layer 36.

The gate electrode 30 is made of a low resistive material such as aluminum in order to reduce a RC delay. The gate insulating layer 34 is deposited at a low temperature of less than 350 and is made of SiNx or $SiO_2$. The active layer 34 is made of an hydrogenated amorphous silicon (a-Si:H). The ohmic contact layer 36 is formed in such a way that a gas containing a boron (B) of a boron group or a phosphorous (P) of a nitrogen group is ion-doped into the amorphous silicon layer. The ohmic contact layer 36 is generally is made of $n^+$-type hydrogenated amorphous silicon ($n^+$ a-Si:H) doped with $PH_3$ containing a phosphorous (P). The source and drain electrodes 42 and 44 are made of Cr or Mo.

In order to form the TFT, a deposition process is repeated several times, for example, using a plasma-enhanced chemical vapor deposition (PECVD) technique. The gate insulating layer 32, the active layer 34 and the ohmic contact layer 36 undergo a deposition process in the same process chamber.

FIG. 3 is a graph illustrating a relationship between an RF-power used to form a layer and each of the layers 32, 34 and 36 when the gate insulating layer 32, the active layer 34 and the ohmic contact layer 36 are deposited.

In order to form the gate insulating layer 32, a mixed gas of $NH_3$, $N_2$ and $SiH_4$ is injected into the process chamber and is decomposed by plasma, so that a silicon nitride film (SiNx) is formed on the substrate.

In order to form the active layer 34, $NH_3$ and $N_2$ that are used to deposit the gate insulating layer 32 are pumped out, and $H_2$ are added. The pure amorphous silicon (a-Si:H) is formed using $SiH_4$ and $H_2$.

Then, in order to form the ohmic contact layer 36, a small amount of $PH_3$ is added to the mixed gas of $SiH_4$ and $H_2$ to form an $n^+$ type amorphous silicon layer (a-Si:H).

The active layer 34 generally contains a hydrogen (H). Electrical characteristics of the amorphous silicon TFTs depend on a density of state (DOS). The silicon atoms of the active layer 34 have 4 outmost electrons, among them uncombined electrons cause a dangling bond problem. The dangling bond problem can be solved by the hydrogen.

As described above, in order to remove the mixed gases used to deposit the gate insulating layer, the active layer and the ohmic contact layer, plasma condition should be released first. After a predetermined time passes, the mixed gas in the process chamber is pumped.

FIG. 4 is a graph illustrating a relationship between an internal pressure variation of the process chamber and each of the layers when the gate insulating layer 32, the active layer 34 and the ohmic contact layer 36 are deposited. After a deposition of the gate insulating layer 32, since the mixed gas is removed in the state that the plasma condition is released, an internal pressure of the process chamber varies suddenly. When the internal pressure of the process chamber varies, the polymer generated during the deposition process may fall onto a surface of the gate insulating layer, leading to inferiority in subsequent processes.

Further, when the active layer is formed, a predetermined time is required to maintain an initial plasma state. At this time, the deposited active layer has defects suchas a dangling bond. As a result, the quality of an interface between the insulating layer and the active layer becomes inferior, and therefore current-voltage characteristics of the TFT are lowered.

Furthermore, an interface (see a portion "A" of FIG. 2) between the gate insulating layer and the active layer may have defects due to a lattice mismatch because of the difference of the atoms of the insulating layer and the active layer when the thin films are formed, thereby deteriorating electrical characteristics of the TFT. In other words, a threshold voltage of the TFT may increase, a switching operation may become impossible, and there may come a problem in stability. For example, charges are accumulated on the interface between the gate insulating layer 32 and the active layer 34, thereby lowering an ON current and deteriorating the operation of the TFT.

SUMMARY OF THE INVENTION

To overcome the problems described above, preferred embodiments of the present invention provide a method of manufacturing a thin film transistor minimizing defects generated when thin films of the thin film transistor are formed.

It is another object of the invention to provide a method of forming thin films for the thin film transistor, which can lower the manufacturing time.

In order to achieve the above and other objects, the preferred embodiments of the present invention provide a method of manufacturing a thin film transistor, including: preparing a process chamber having a stage; providing a substrate on the stage of the process chamber; injecting a first mixed gas of $NH_3$, $N_2$ and $SiH_4$ into the process chamber; forming a silicon nitride film (SiNx) on the substrate with the first mixed gas by creating a plasma state in the process chamber; injecting a second mixed gas of $H_2$ and $SiH_4$ into the process chamber while removing the first mixed gas in the plasma state; forming a pure amorphous silicon film (a-Si:H) on the silicon nitride film using the second mixed gas in the plasma state; injecting a third mixed gas of $H_2$, $SiH_4$ and $PH_3$ into the process chamber while removing the second mixed gas in the plasma state; and forming a doped amorphous silicon film ($n^+$ a-Si:H) on the silicon nitride film using the third mixed gas in the plasma state.

The method further includes forming a gate electrode before the step of forming the silicon nitride film; and forming source and drain electrodes on the doped amorphous silicon film. The method further includes performing a hydrogen plasma treatment on a surface of the silicon nitride film before the step of forming the pure amorphous silicon film. The method further includes performing a hydrogen plasma treatment on a surface of the pure amorphous silicon film before the step of forming the doped amorphous silicon film.

The method of manufacturing the TFT according to the preferred embodiment of the present invention has the following advantages. Firstly, since each of the thin films is deposited in the plasma state, variation of an internal atmosphere of the process chamber is minimized, whereupon a processing time is shortened. Secondly, since the thin films deposited are hydrogen plasma-treated, the hydrogen plasma removes defects at the interface between the thin films, whereupon defects can be prevented. Thirdly, since each of the thin films is deposited under the same pressure, an occurrence of a polymer in the process chamber can be prevented, and interface characteristics of the thin films can be improved significantly.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to a preferred embodiment of the present invention, example of which is illustrated in the accompanying drawings.

Figure 5:
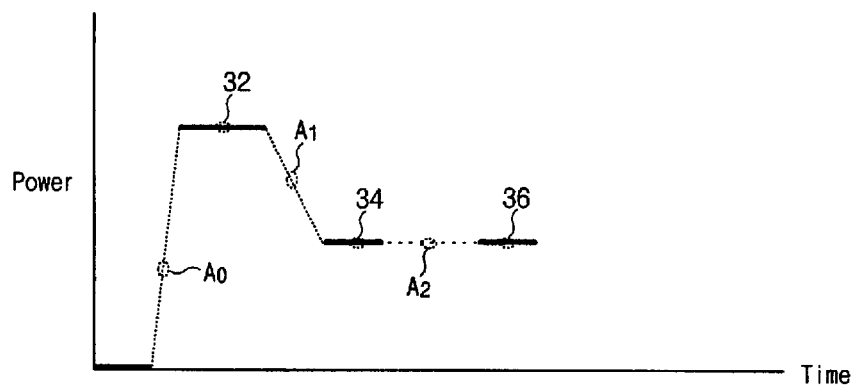
FIG. 5 is a graph illustrating a relationship between a RF-power and a thin film deposition according to a preferred embodiment of the present invention.

FIG. 5 is a graph illustrating a relationship between a RF-power and thin film depositions according to a preferred embodiment of the present invention. As shown in FIG. 5, except for a process of injecting a first mixed gas of $NH_3$, $N_2$ and $SiH_4$ into the process chamber in order to deposit a gate insulating layer, the power maintains at an ON state through the entire deposition processes.

First, in the deposition process, a first mixed gas (e.g., $NH_3+N_2+SiH_4$) stabilized under a predetermined pressure is maintained in a first plasma state "$A_0$" by a predetermined RF power intensity, and then the gate insulating layer is deposited. At this point, a deposition temperature of the thin films is one of the most important parameters used to control a surface reaction of a semiconductor layer during a deposition process. In other words, since precursors actively react on hydrogen at a temperature of about 300° C. and also the number of the silicon dangling bond is decreased at that temperature, controlling a deposition temperature is very important.

Subsequently, after depositing the gate insulating layer 32 using the first mixed gas, the first mixed gas is removed while the plasma state is maintained (i.e., without OFF of a power). At the same time, a $H_2$ gas is injected into the process chamber. That is, in a second plasma state "$A_1$", a removal of the first mixed gas ($NH_3+N_2+SiH_4$) and an injection of the $H_2$ gas are simultaneously carried out. At this time, there is a little variation of the pressure, but the pressure may vary in a range of less than 200 mTorr.

At this point, in the second plasma state "$A_1$", a hydrogen ($H_2$) plasma treatment is performed by adjusting radio frequency energy within the chamber during a predetermined time period. The hydrogen plasma terminates the dangling bond that may occur on a surface of the gate insulating layer. In other words, the hydrogen plasma functions to remove or prevent defects that otherwise exist on the surface of the gate insulating layer.

Subsequently, in the hydrogen plasma state "$A_2$", a $SiH_4$ gas is injected into the process chamber to create a second mixed gas, so that an active layer 34 is formed using the second mixed gas ($H_2+SiH_4$).

After forming the active layer, the $SiH_4$ gas is removed from the second mixed gas, and the active layer is hydrogen plasma-treated in the third plasma state "$A_2$".

Next, the $SiH_4$ gas and a $PH_3$ gas are added to the $H_2$ gas to create a third mixed gas ($SiH_4+PH_3+H_2$), and an ohmic contact layer 36 ($n^+$ a-Si:H) is formed on the active layer using the third mixed gas.

As described above, a method of forming the thin films according to the preferred embodiment of the present invention does not turn off the RF power while depositing the gate insulating layer, the active layer and the ohmic contact layer, whereby defects due to a lattice mismatch can be prevented. As a result, since defects on the interface of each of the thin films are decreased, charges that are trapped due to these defects are decreased, and therefore trapped charges do not prevent a flow of the charges. This improves greatly electrical characteristics of the TFT.

Figure 6:
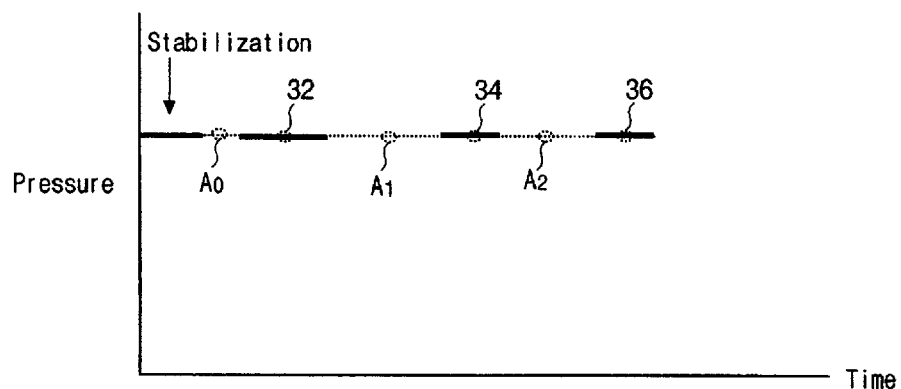
FIG. 6 is a graph illustrating a variation of an internal pressure of the process chamber during deposition processes of the thin films according to the present invention.

FIG. 6 is a graph illustrating a variation of an internal pressure of the process chamber during a deposition process of the thin films according to an embodiment of the present invention. As shown in FIG. 6, there is little or minimal variation of the internal pressure during a deposition process of the thin films (the gate insulating layer, the active layer and the ohmic contact layer). Therefore, defects that may occur on a surface of the thin films due to a variation of the internal pressure can be prevented.

Figure 1:
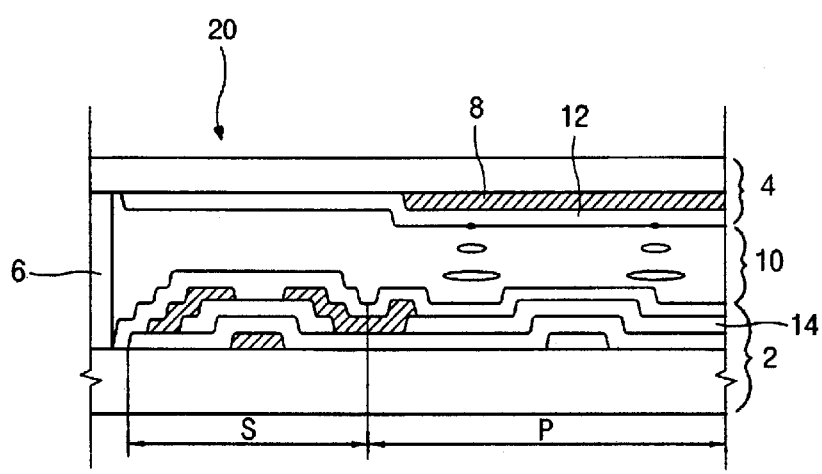
FIG. 1 is a cross-sectional view illustrating a liquid crystal panel of a conventional active matrix liquid crystal display device.
Figure 2:
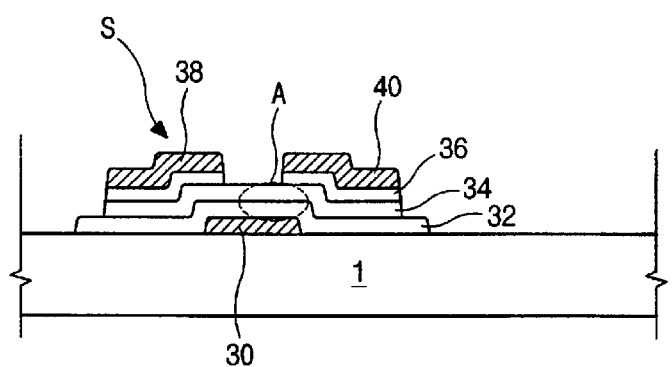
FIG. 2 is a cross-sectional view illustrating a conventional back channel etch type thin film transistor.
Figure 3:
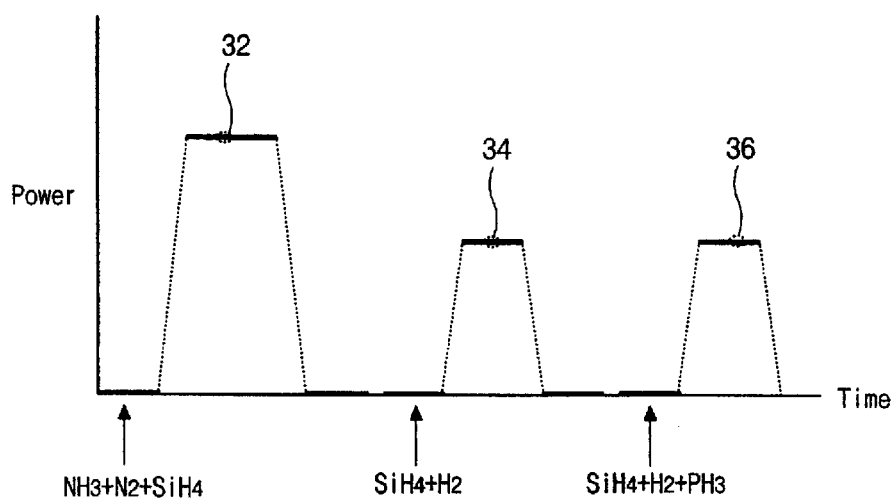
FIG. 3 is a graph illustrating a conventional relationship between a RF-power and thin film depositions.
Figure 4:
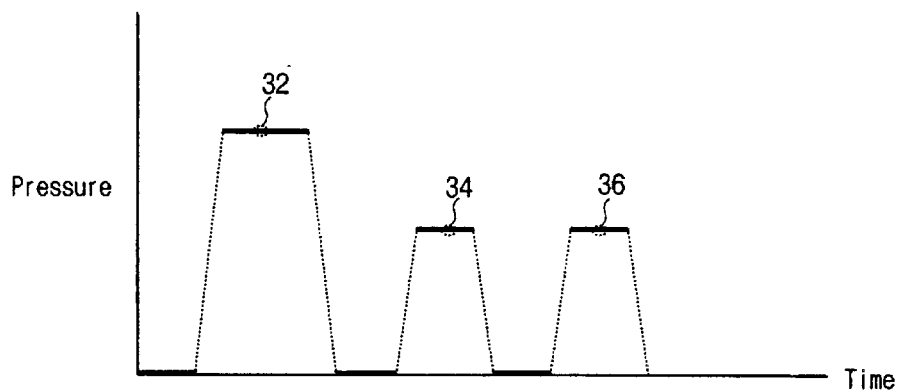
FIG. 4 is a graph illustrating a conventional relationship between an internal pressure variation of a process chamber and thin film depositions.

A method of forming other components such as a gate electrode, a source electrode and a drain electrode shown in FIG. 2 is same as the conventional art and thus its explanation is omitted.

As described herein before, the method of manufacturing the TFT according to the preferred embodiments of the present invention has the following advantages. Firstly, since each of the thin films is deposited in the plasma state, variation of an internal atmosphere of the process chamber is minimized, whereupon a processing time becomes shortened. Secondly, since the thin films deposited are hydrogen plasma-treated, the hydrogen plasma removes or prevents defects on the interface between the thin films, whereupon defects can be prevented. Thirdly, since each of the thin films is deposited under the same or similar pressure, an occurrence of a polymer in the process chamber can be prevented, and interface characteristics of the thin films can be improved significantly.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of manufacturing a thin film transistor, comprising:

preparing a process chamber having a stage;

providing a substrate on the stage of the process chamber;

injecting a first mixed gas of $NH_3$, $N_2$ and $SiH_4$ into the process chamber;

forming, in the process chamber, a silicon nitride film (SiNx) on the substrate using the first mixed gas by creating a plasma state in the process chamber;

injecting a second mixed gas of $H_2$ and $SiH_4$ into the process chamber;

forming, in the process chamber, a pure amorphous silicon film on the silicon nitride film using the second mixed gas;

injecting a third mixed gas of $H_2$, $SiH_4$ and $PH_3$ into the process chamber; and forming, in the process chamber, a doped amorphous silicon film on the silicon nitride film using the second mixed gas.

wherein power is continuously supplied to the process chamber through the injecting steps and the forming steps.

2. The method of claim 1, further comprising;

forming a gate electrode before the step of forming the silicon nitride film; and forming source and drain electrodes on the doped amorphous silicon film.

3. The method of claim 1, further comprising:

performing a hydrogen plasma treatment on an interface of the silicon nitride film before the step of forming the pure amorphous silicon film.

4. The method of claim 1, further comprising:

performing a hydrogen plasma treatment on an interface of the pure amorphous silicon film before the step of forming the doped amorphous silicon film.

5. The method of claim 1, wherein, in the process chamber, a pressure variation is under 200 mTorr.

6. The method of claim 1, wherein a substantially constant pressure is maintained in the process chamber through the injecting steps and the forming steps.

7. The method of claim 1, further comprising:

removing the first mixed gas during the plasma state in the process chamber.

8. The method of claim 7, wherein the removing step is performed while the step of injecting the second mixed gas is performed.

9. The method of claim 8, further comprising:

removing the second mixed gas during the plasma state in the process chamber.

10. The method of claim 9, wherein the step of removing the second mixed gas is performed while the step of injecting the third mixed gas is performed.

11. A method of manufacturing a thin film structure, the method comprising the steps of:

(a) providing a process chamber;

(b) providing a substrate in the process chamber;

(c) injecting a first mixed gas into the process chamber;

(d) forming, in the process chamber, a silicon nitride film on the substrate using the first mixed gas;

(e) injecting a second mixed gas into the process chamber while removing the first mixed gas from the processing chamber; and (f) forming, in the process chamber, a first amorphous silicon film over the silicon nitride film using the second mixed gas.

wherein the steps (c), (d), (e), and (f) are performed while the process chamber is maintained in a plasma state.

12. The method of claim 11, wherein the plasma state includes at least one of the following conditions:

a substantially constant chamber pressure in the process chamber; or a power being supplied to the process chamber.

13. The method of claim 12, further comprising the steps of:

(g) injecting a third mixed gas into the process chamber while removing the second mixed gas from the process chamber; and (h) forming, in the process chamber, a third amorphous silicon film over the silicon nitride film using the third mixed gas.

14. The method of claim 13, wherein the steps (g) and (h) are performed while the process chamber is maintained in the plasma state.

15. The method of claim 14, wherein the first and second amorphous silicon films are a pure amorphous silicon film and a doped amorphous silicon film, respectively.

16. The method of claim 15, wherein the first mixed gas includes $NH_3$, $N_2$ and $SiH_4$.

17. The method of claim 16, wherein the second mixed gas includes $H_2$ and $SiH_4$.

18. The method of claim 17, wherein the third mixed gas includes $H_2$, $SiH_4$ and $PH_3$.

19. The method of claim 15, further comprising the steps of:

(i) forming a gate electrode before the step (d) of forming the silicon nitride film; and (j) forming source and drain electrodes on the second amorphous silicon film.

20. The method of claim 15, further comprising the step of:

(k) applying a hydrogen plasma treatment to an interface of the silicon nitride film before the step (f) of forming the first amorphous silicon film.

21. The method of claim 15, further comprising the step of:

(l) applying a hydrogen plasma treatment to an interface of the first amorphous silicon film before the step (h) of forming the second amorphous silicon film.

22. The method of claim 11, wherein, in the process chamber, a pressure variation is under 200 mTorr.

* * * * *